United States Patent
Dornisch et al.

(10) Patent No.: US 7,268,038 B2
(45) Date of Patent: Sep. 11, 2007

(54) METHOD FOR FABRICATING A MIM CAPACITOR HAVING INCREASED CAPACITANCE DENSITY AND RELATED STRUCTURE

(75) Inventors: Dieter Dornisch, Carlsbad, CA (US); Kenneth M. Ring, Tustin, CA (US); Tinghao F. Wang, Irvine, CA (US); David Howard, Irvine, CA (US); Guangming Li, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 181 days.

(21) Appl. No.: 10/997,638

(22) Filed: Nov. 23, 2004

(65) Prior Publication Data

US 2006/0110889 A1    May 25, 2006

(51) Int. Cl.
*H01L 21/8242* (2006.01)
(52) U.S. Cl. ............... 438/250; 257/303; 257/E21.351; 438/240; 438/396
(58) Field of Classification Search ............... 438/381, 438/396, 239, 240, 244, 250; 257/303, E21.351
See application file for complete search history.

(56) References Cited

U.S. PATENT DOCUMENTS

| | | | |
|---|---|---|---|
| 5,926,359 A * | 7/1999 | Greco et al. ................ | 361/311 |
| 6,459,562 B1* | 10/2002 | KarRoy et al. ............. | 361/312 |
| 2006/0084236 A1* | 4/2006 | Vogt .......................... | 438/381 |

* cited by examiner

*Primary Examiner*—Asok Kumar Sarkar
(74) *Attorney, Agent, or Firm*—Farjami & Farjami LLP

(57) ABSTRACT

According to one embodiment of the invention, a method for fabricating a MIM capacitor in a semiconductor die includes a step of depositing a first interconnect metal layer. The method further includes depositing a layer of silicon nitride on the first interconnect layer. The layer of silicon nitride is deposited in a deposition process using an ammonia-to-silane ratio of at least 12.5. The method further includes depositing a layer of MIM capacitor metal on the layer of silicon nitride. The method further includes etching the layer of MIM capacitor metal to form an upper electrode of the MIM capacitor. According to this exemplary embodiment, the method further includes etching the layer of silicon nitride to form a MIM capacitor dielectric segment and etching the first interconnect metal layer to form a lower electrode of the MIM capacitor. The MIM capacitor has a capacitance density of at least 2.0 fF/um$^2$.

14 Claims, 2 Drawing Sheets

METHOD FOR FABRICATING A MIM CAPACITOR HAVING INCREASED CAPACITANCE DENSITY AND RELATED STRUCTURE

BACKGROUND OF THE INVENTION

1. Field of the Invention

The present invention is generally in the field of semiconductor fabrication. More specifically, the invention is in the field of fabrication of capacitors in semiconductor dies.

2. Background Art

High performance mixed signal and RF circuits require high-density integrated capacitors. Metal-insulator-metal ("MIM") capacitors can be considered for use in the fabrication of integrated mixed signal and RF circuits on semiconductor dies. However, typical MIM capacitors have low capacitance density and since RF and mixed signal applications require high capacitance values, the die area consumed by typical MIM capacitors is too large, resulting in increased die cost to the manufacturer.

In a conventional MIM capacitor, a MIM capacitor dielectric is situated between bottom and top metal plates, which form electrodes of the MIM capacitor. The MIM capacitor dielectric is distinct from an interlayer dielectric layer, which is formed between adjacent interconnect metal layers of a semiconductor die. The capacitance density of the conventional MIM capacitor is approximately 1.0 femtofarad ("fF")/um$^2$ for a conventional MIM capacitor dielectric comprising silicon oxide or silicon nitride. In order to increase the capacitance density of the conventional MIM capacitor, a dielectric material having a higher dielectric constant can be used or the thickness of the MIM capacitor dielectric can be reduced.

However, the breakdown voltage and the leakage current of the dielectric material limit how thin the MIM capacitor dielectric can be. For example, in a conventional MIM capacitor dielectric comprising silicon nitride, the breakdown voltage and leakage current of the silicon nitride prevent the thickness of the conventional MIM capacitor dielectric from being thinner than approximately 615.0 Angstroms with significantly reducing reliability.

Thus, there is a need in the art for increased capacitance density in a MIM capacitor.

SUMMARY OF THE INVENTION

The present invention is directed to a method for fabricating a MIM capacitor having increased capacitance density and related structure. The present invention addresses and resolves the need in the art for increased capacitance density in a MIM capacitor.

According to one embodiment of the invention, a method for fabricating a MIM capacitor in a semiconductor die includes a step of depositing a first interconnect metal layer. The method further includes depositing a layer of silicon nitride on the first interconnect layer. The layer of silicon nitride is deposited in a deposition process using an ammonia-to-silane ratio of at least 12.5. For example, the ammonia-to-silane ratio may be between approximately 12.5 and approximately 16.0. The method further includes depositing a layer of MIM capacitor metal on the layer of silicon nitride. The MIM capacitor metal may be titanium nitride, for example. The method further includes etching the layer of MIM capacitor metal to form an upper electrode of the MIM capacitor.

According to this exemplary embodiment, the method further includes etching the layer of silicon nitride to form a MIM capacitor dielectric segment and etching the first interconnect metal layer to form a lower electrode of the MIM capacitor. The MIM capacitor as formed has a capacitance density of at least 2.0 fF/um$^2$. The MIM capacitor dielectric segment can have a thickness of between approximately 300.0 Angstroms and approximately 350.0 Angstroms, for example. The method can further include depositing an interlayer dielectric layer over the upper electrode of the MIM capacitor. The method can further include depositing a second interconnect metal layer on the interlayer dielectric layer and forming an interconnect metal segment in the second interconnect metal layer, where the interconnect metal segment is electrically connected to the upper electrode of the MIM capacitor. In one embodiment, the invention is a MIM capacitor fabricated by utilizing the above-discussed method. Other features and advantages of the present invention will become more readily apparent to those of ordinary skill in the art after reviewing the following detailed description and accompanying drawings.

DETAILED DESCRIPTION OF THE INVENTION

The present invention is directed to a method for fabricating a MIM capacitor having increased capacitance density and related structure. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
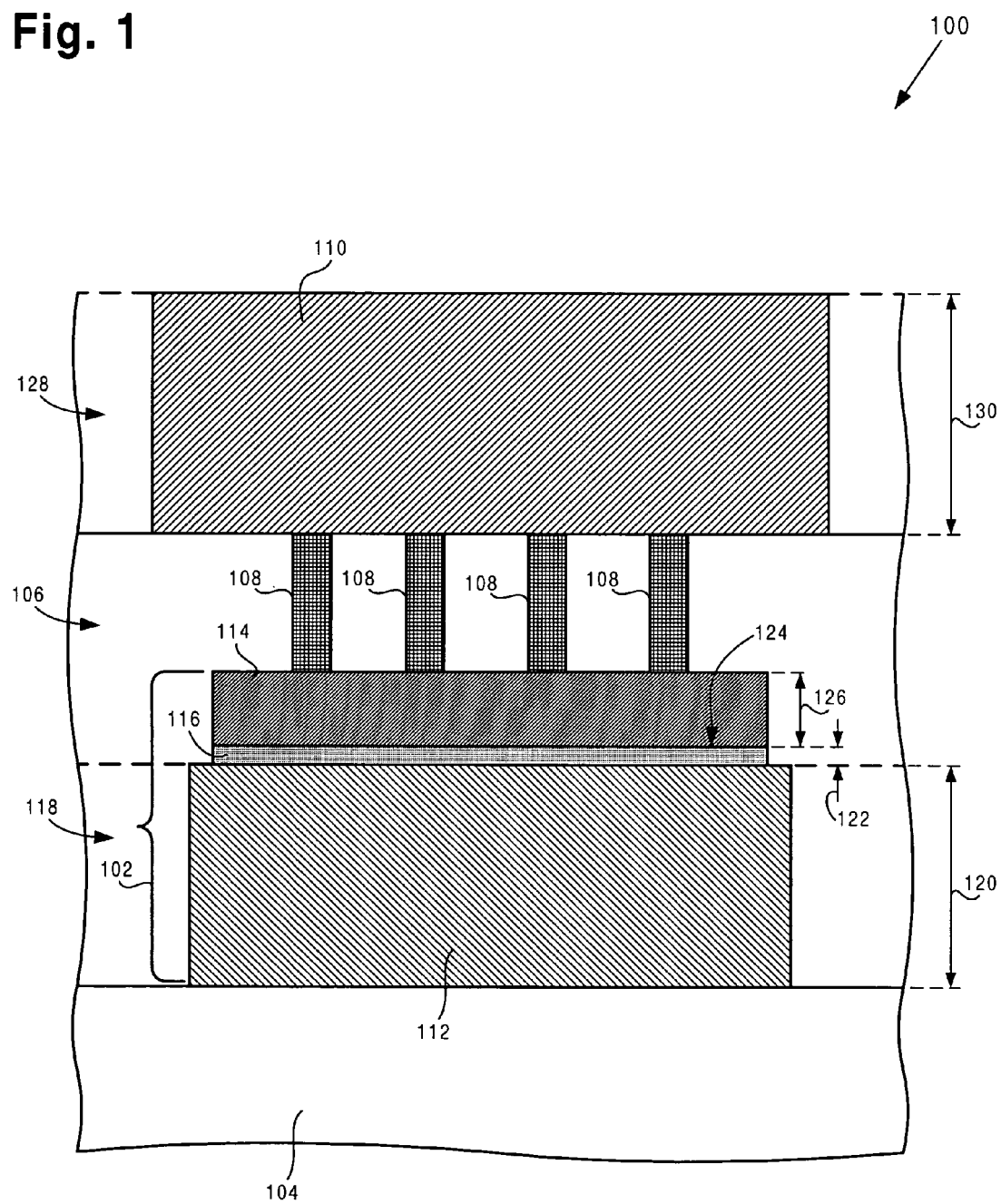
FIG. 1 illustrates a cross-sectional view of an exemplary structure including an exemplary MIM capacitor in accordance with one embodiment of the present invention.

FIG. 1 shows a cross-sectional view of a portion of a semiconductor die comprising an exemplary MIM capacitor in accordance with one embodiment of the present invention. Certain details and features have been left out of FIG. 1A, which are apparent to a person of ordinary skill in the art. As shown in FIG. 1, structure 100 includes MIM capacitor 102, interlayer dielectric layers 104 and 106, vias 108, and interconnect metal segment 110. MIM capacitor 102 further includes metal plates 112 and 114 and MIM capacitor dielectric segment 116.

Also shown in FIG. 1, metal plate 112 is situated on interlayer dielectric layer 104 in interconnect metal layer 118 and can comprise aluminum or other suitable metal. Metal plate 112 has thickness 120, which can be, for example, approximately 6000.0 Angstroms. Metal plate 112 can be formed by depositing, patterning, and etching a layer of interconnect metal in a manner known in the art. In the present embodiment, interconnect metal layer 118 can be a second interconnect metal layer in a semiconductor die. In other embodiments, interconnect metal layer 118 may be a first, third, fourth, or higher interconnect metal layer in a semiconductor die. Metal plate 112 forms a "lower" electrode of MIM capacitor 102. It is noted that, for the purpose of the present application, the "lower" electrode is defined as the electrode closer to interlayer dielectric layer 104 (i.e. closer to the substrate surface, which is not shown).

Further shown in FIG. 1, MIM capacitor dielectric segment 116 is situated on metal plate 112 and can comprise silicon nitride ("SiN"). MIM capacitor dielectric segment 116 has thickness 122, which can be approximately 330.0 Angstroms. In one embodiment, thickness 122 can be between approximately 300.0 Angstroms and approximately 350.0 Angstroms. MIM capacitor dielectric segment 116 can be formed by depositing, patterning, and etching a layer of silicon nitride on interconnect metal layer 118. The layer of silicon nitride can be deposited using a chemical vapor deposition ("CVD") process or other appropriate processes. In the deposition process, ammonia ("$NH_3$") is used as a precursor for nitride and silane ("$SiH_4$") is used as a precursor for silicon. In the present invention, the precursor ratio of $NH_3$ to $SiH_4$ is significantly increased in the silicon nitride deposition process, which changes the stoichiometry of the deposited layer of silicon nitride. For example, the ratio of $NH_3$ to $SiH_4$, i.e. the ratio of ammonia to silane, can be increased to at least 12.5. In one embodiment, the ratio of $NH_3$ to $SiH_4$, can be increased to between approximately 12.5 and approximately 16.0. In contrast, in a conventional MIM capacitor dielectric deposition process, the ratio of $NH_3$ to $SiH_4$ can be between 8.5 and 10.0.

By increasing the precursor ratio of $NH_3$ to $SiH_4$ to at least 12.5 in the silicon nitride deposition process, the present invention achieves a layer of silicon nitride having increased quality. As a result of increasing the quality of the deposited layer of silicon nitride, the leakage current through MIM capacitor dielectric segment 116, which is formed by appropriately patterning and etching the deposited layer of silicon nitride, is reduced and the breakdown voltage of MIM capacitor dielectric segment 116 is advantageously increased. Also, by reducing the leakage current and increasing the breakdown voltage of MIM capacitor dielectric segment 116, the reliability of MIM capacitor dielectric segment 116 is increased. Further, by reducing the leakage current and increasing the breakdown voltage of MIM capacitor dielectric segment 116, thickness 122 of MIM capacitor dielectric segment 116 can be substantially reduced to between approximately between approximately 330.0 Angstroms.

As a result of reducing thickness 122 of dielectric segment 116 to approximately 330.0 Angstroms, the present invention advantageously achieves a MIM capacitor, i.e. MIM capacitor 102, having a substantially increased capacitance density of at least 2.0 $fF/um^2$. In one embodiment, the present invention's MIM capacitor can have a capacitance density greater 2.0 $fF/um^2$. In contrast, in a conventional MIM capacitor having a conventional silicon nitride dielectric layer, relatively high leakage current and relatively low breakdown voltage of the conventional silicon nitride dielectric layer prevents the thickness of the conventional silicon nitride layer form being reduced below approximately 615.0 Angstroms without significantly reducing reliability. As a result, the capacitance density of the conventional MIM capacitor having a conventional silicon nitride dielectric layer is limited to approximately 1.0 $fF/um^2$.

After the layer of silicon nitride has been deposited, a post treatment may be applied to the layer of silicon nitride by subjecting the top surface of the layer of silicon nitride to an oxygen plasma, which oxidizes the top surface of the silicon nitride layer. As a result of the oxygen plasma post treatment process, resistance of interface 124, which is the interface between MIM capacitor dielectric segment 116 and metal plate 114, is increased, which can further reduce the leakage current of MIM capacitor dielectric segment 116. By way of example, the oxygen plasma post treatment process can further reduce the leakage current of MIM capacitor dielectric segment 116 by a factor of between approximately 5.0 and approximately 10.0.

Also shown in FIG. 1, metal plate 114 is situated on MIM capacitor dielectric segment 116 and can comprise titanium nitride or other suitable metal or metallic material. Metal plate 114 has thickness 126, which can be, for example, approximately 1500.0 Angstroms. Metal plate 114 can be formed by depositing a layer of MIM capacitor metal, such as a layer of titanium nitride, on a layer of silicon nitride using a physical vapor deposition ("PVD") process, a CVD process, or other appropriate process. The layer of MIM capacitor metal, such as a layer of titanium nitride, can be appropriately patterned and etched in a MIM capacitor stack etch to form metal plate 114. The patterning process can include, for example, depositing and patterning a first layer of photoresist on the layer of MIM capacitor metal.

During the MIM capacitor stack etch, the layer of MIM capacitor metal is etched to form metal plate 114 and the layer of silicon nitride is etched to form MIM capacitor dielectric segment 116. Metal plate 114 forms an "upper" electrode of MIM capacitor 102. It is noted that, for the purpose of the present application, the "upper" electrode is defined as the electrode further from interlayer dielectric 104 (i.e. further from the substrate surface which is not shown). It is also noted that, unlike metal plate 112, metal plate 114 is not formed in an interconnect metal layer. In other words, metal plate 114 is formed within interlayer dielectric 106, where conventionally no metal plate exists. After metal plate 114 and MIM capacitor dielectric segment 116 have been formed, the first layer of photoresist can be removed and a second layer of photoresist can be deposited and patterned on interconnect metal layer 118 and over metal plate 114 and MIM capacitor dielectric segment 116. Interconnect metal layer 118 can then be etched to form metal plate 112.

Further shown in FIG. 1, interlayer dielectric layer 106 is situated over MIM capacitor 102 and interconnect metal layer 118. Interlayer dielectric layer 106 can comprise silicon oxide or other appropriate dielectric material and can be formed by CVD process or other appropriate deposition process. In one embodiment, interlayer dielectric layer 106 may comprise a dielectric with a low dielectric constant, i.e. "a low-k dielectric," which has a lower dielectric constant than silicon oxide. Also shown in FIG. 1, vias 108 are situated in interlayer dielectric layer 106. In particular, vias 108 are situated over, and are in contact with, metal plate 114. Vias 108 may be formed by etching interlayer dielectric layer 106 by a standard via etch process and the vias may be filled by a suitable electrically conducting material, such as tungsten.

Further shown in FIG. 1, interconnect metal segment 110 is situated in interconnect metal layer 128 over vias 108. In the present embodiment, interconnect metal layer 128 can be a third interconnect metal layer in a semiconductor die. In other embodiments, interconnect metal layer 128 may be a second, fourth, fifth, or higher interconnect metal layer in a semiconductor die. Interconnect metal segment 110 can comprise aluminum or other suitable metal and has thickness 130, which can be, for example, approximately 6000.0 Angstroms. Interconnect metal segment 110 may be formed by depositing and patterning a layer of interconnect metal on interlayer dielectric layer 106 in a manner known in the art. Interconnect metal segment 110 is electrically connected to metal plate 114, i.e. the upper electrode of MIM capacitor 102, by vias 108.

Figure 2:
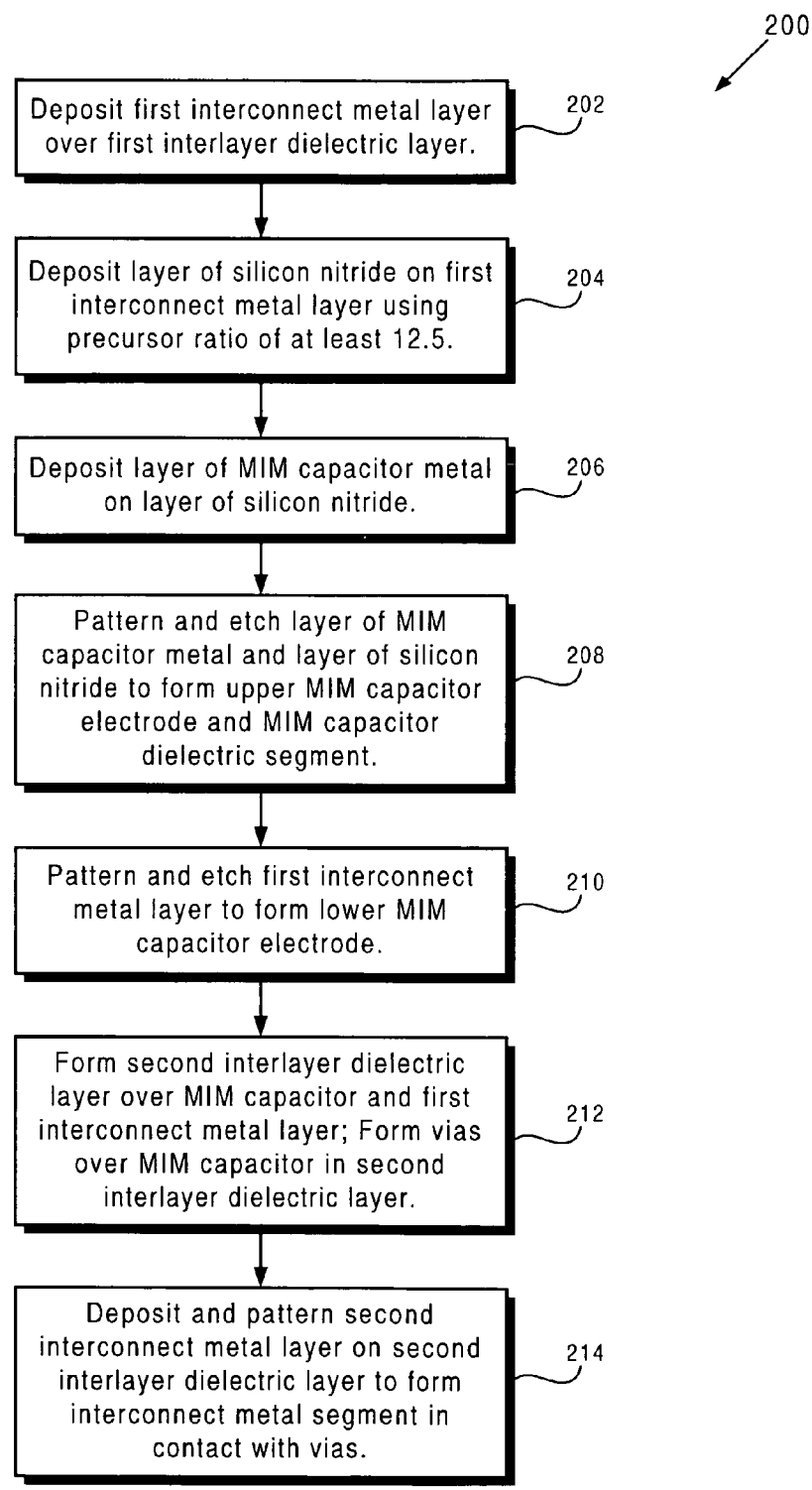
FIG. 2 shows a flowchart illustrating the steps taken to implement an embodiment of the present invention.

FIG. 2 shows flowchart 200, which describes the steps, according to one embodiment of the present invention, of a process by which MIM capacitor 102 in structure 100 in FIG. 1 is fabricated. Certain details and features have been left out of flowchart 200 that are apparent to a person of ordinary skill in the art. For example, a step may consist of one or more substeps or may involve specialized equipment or materials, as known in the art. Steps 202 through 214 indicated in flowchart 200 are sufficient to describe one embodiment of the present invention, other embodiments of the invention may utilize steps different from those shown in flowchart 200. It is noted that the processing steps shown in flowchart 200 are performed on a wafer, which, prior to step 202, includes a first interlayer dielectric layer, e.g. interlayer dielectric 104 shown in FIG. 1.

At step 202 of flowchart 200, a first interconnect metal layer is deposited over a first interlayer dielectric layer, i.e. interlayer dielectric layer 104. The first interconnect metal layer, i.e. interconnect metal layer 118, for example, can be interconnect metal layer two of a semiconductor die. At step 204 of flowchart 200, a layer of silicon nitride is deposited on the first interconnect metal layer, i.e. interconnect metal layer 118 in a deposition process using a precursor ratio of $NH_3$ to $SiH_4$ of at least 12.5. In one embodiment, the precursor ratio of $NH_3$ to $SiH_4$ can be increased to between approximately 12.5 and approximately 16.0. The layer of silicon nitride can be deposited using a CVD process or other appropriate process and can have a thickness of approximately 330.0 Angstroms.

At step 206 of flowchart 200, a layer of MIM capacitor metal comprising, for example, titanium nitride is deposited on the layer of silicon nitride. The MIM capacitor metal may have a thickness of approximately 1500.0 Angstroms and may be deposited using a PVD process, a CVD process, or other appropriate process. At step 208 of flowchart 200, the layer of MIM capacitor metal and the layer of silicon nitride are patterned and etched to form an upper MIM capacitor electrode, i.e. metal plate 114, and a MIM capacitor dielectric segment, i.e. dielectric segment 116. The layer of MIM capacitor metal and the layer of silicon nitride can be patterned and etched in a manner known in the art.

At step 210 of flowchart 200, the first interconnect metal layer, i.e. interconnect metal layer 118, can be patterned and etched to form a lower MIM capacitor electrode, i.e. metal plate 112. For example, the first interconnect metal layer may be patterned by depositing and patterning a layer of photoresist over metal plate 114 and dielectric segment 116 and the first interconnect metal layer may be etched using an appropriate etch process. As a result, MIM capacitor 102, which comprises MIM capacitor dielectric segment 116 situated between metal plate 112 (i.e. a lower electrode of MIM capacitor 102) and metal plate 114 (i.e. an upper electrode of MIM capacitor 102) is formed.

At step 212 of flowchart 200, a second interlayer dielectric layer, i.e. interlayer dielectric layer 106 is formed over MIM capacitor 102 and the first interconnect metal layer, i.e. interconnect metal layer 118. The second interlayer dielectric layer may comprise silicon oxide or other appropriate dielectric material and may be deposited using a CVD process or other appropriate deposition processes. Vias 108 are formed in the second interlayer dielectric layer, i.e. interlayer dielectric layer 106, over, and in contact with, the upper electrode of MIM capacitor 102, i.e. metal plate 114. Vias 108 may be formed by etching the second interlayer dielectric layer by a standard via etch process and can be filled with an electrically conductive material such as tungsten, for example.

At step 214 of flowchart 200, a second interconnect metal layer, i.e. interconnect metal layer 128, is deposited and patterned on the second interlayer dielectric layer to form an interconnect metal segment, i.e. interconnect metal segment 110, in contact with vias 108. The second interconnect metal layer can comprise aluminum, for example, and may have a thickness of approximately 6000.0 Angstroms. The second interconnect metal layer can be in interconnect metal layer three of a semiconductor die, for example. The interconnect metal segment is electrically connected to metal plate 114, i.e. the upper electrode of MIM capacitor 102, by vias 108.

Thus, as described above, by depositing a layer of silicon nitride in a deposition process having an ammonia-to-silane precursor ratio of at least 12.5, the present invention advantageously achieves a MIM capacitor dielectric segment having reduced leakage current, increased breakdown voltage, and increased reliability. By reducing leakage current, increasing breakdown voltage, and increasing reliability in a MIM capacitor dielectric segment, the present invention provides a MIM capacitor dielectric segment having reduced thickness compared to a conventional MIM capacitor comprising a silicon nitride dielectric. As a result, the present invention advantageously achieves a MIM capacitor having a substantially increased capacitance density of, for example, at least 2.0 $fF/um^2$.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for fabricating a MIM capacitor having increased capacitance density and related structure have been described.

The invention claimed is:

1. A method for fabricating a MIM capacitor in a semiconductor die, said method comprising steps of:
    depositing a first interconnect metal layer;
    depositing a layer of silicon nitride on said first interconnect metal layer;
    etching said layer of silicon nitride to form a MIM capacitor dielectric segment;
    depositing a layer of MIM capacitor metal on said layer of silicon nitride;
    etching said layer of MIM capacitor metal to form an upper electrode of said MIM capacitor;
    wherein said MIM capacitor dielectric segment has a thickness of less than approximately 350.0 Angstroms, and wherein said layer of silicon nitride is deposited in a deposition process using an ammonia-to-silane ratio of at least 12.5, such that said MIM capacitor has a capacitance density of at least 2.0 fF/um$^2$.

2. The method of claim 1 further comprising a step of: etching said first interconnect metal layer to form a lower electrode of said MIM capacitor.

3. The method of claim 2 further comprising a step of depositing an interlayer dielectric layer over said upper electrode of said MIM capacitor.

4. The method of claim 3 further comprising steps of:
depositing a second interconnect metal layer on said interlayer dielectric layer;
forming an interconnect metal segment in said second interconnect metal layer, said interconnect metal segment being electrically connected to said upper electrode of said MIM capacitor.

5. The method of claim 1 wherein said ammonia-to-silane ratio is between approximately 12.5 and approximately 16.0.

6. The method of claim 1 wherein said MIM capacitor metal comprises titanium nitride.

7. A MIM capacitor in a semiconductor die, said MIM capacitor comprising:
a lower electrode of said MIM capacitor, said lower electrode of said MIM capacitor being situated in a first interconnect metal layer in said semiconductor die;
a MIM capacitor dielectric segment situated on said lower electrode of said MIM capacitor, said MIM capacitor dielectric segment comprising silicon nitride;
an upper electrode of said MIM capacitor situated on said MIM capacitor dielectric segment;
wherein said MIM capacitor dielectric segment has a thickness of less than approximately 350.0 Angstroms, and wherein said silicon nitride is deposited in a deposition process comprising an ammonia-to-silane ratio of at least 12.5, said ammonia-to-silane ratio of at least 12.5 enabling said MIM capacitor dielectric segment to have a thickness such that said MIM capacitor has a capacitance density of at least 2.0 fF/um$^2$.

8. The MIM capacitor of claim 7 where said deposition process comprises an ammonia-to-silane ratio of between approximately 12.5 and approximately 16.0.

9. The MIM capacitor of claim 7 wherein an interlayer dielectric layer is situated over said upper electrode of said MIM capacitor.

10. The MIM capacitor of claim 9 wherein an interconnect metal segment is situated on said interlayer dielectric layer, said interconnect metal segment being situated in a second interconnect metal layer of said semiconductor die.

11. The MIM capacitor of claim 10 wherein said interconnect metal segment is connected to said upper electrode of said MIM capacitor by at least one via.

12. A method for fabricating a MIM capacitor in a semiconductor die, said method comprising steps of:
depositing an interconnect metal layer;
depositing a layer of silicon nitride on said first interconnect metal layer;
depositing a layer of MIM capacitor metal on said layer of silicon nitride;
etching said layer of MIM capacitor metal to form a first metal plate, said first metal plate forming an upper electrode of said MIM capacitor;
etching said layer of silicon nitride to form a MIM capacitor dielectric segment;
etching said interconnect metal layer to form a second metal plate, said second metal plate forming a lower electrode of said MIM capacitor;
wherein said MIM capacitor dielectric segment has a thickness of less than approximately 350.0 Angstroms, and wherein said layer of silicon nitride is deposited in a deposition process using an ammonia-to-silane ratio of at least 12.5, such that said MIM capacitor has a capacitance density of at least 2.0 fF/um$^2$.

13. The method of claim 12 wherein said ammonia-to-silane ratio is between approximately 12.5 and approximately 16.0.

14. The method of claim 12 wherein said first metal plate comprises titanium nitride.

* * * * *